(12) United States Patent
Otsuki et al.

(10) Patent No.: US 8,722,816 B2
(45) Date of Patent: May 13, 2014

(54) SOLDER RESIST, DRY FILM THEREOF, CURED PRODUCT, AND PRINTED WIRING BOARD

(75) Inventors: Nobuaki Otsuki, Suita (JP); Manabu Akiyama, Ranzanmachi (JP); Shouji Minegishi, Ranzanmachi (JP); Masao Arima, Ranzanmachi (JP)

(73) Assignees: Nippon Shokubai Co., Ltd., Osaka (JP); Taiyo Holdings Co., Ltd., Tokyo (JP)

( * ) Notice: Subject to any disclaimer, the term of this patent is extended or adjusted under 35 U.S.C. 154(b) by 338 days.

(21) Appl. No.: 12/449,970

(22) PCT Filed: Mar. 4, 2008

(86) PCT No.: PCT/JP2008/053831
§ 371 (c)(1),
(2), (4) Date: Sep. 4, 2009

(87) PCT Pub. No.: WO2008/108359
PCT Pub. Date: Sep. 12, 2008

(65) Prior Publication Data
US 2010/0243304 A1 Sep. 30, 2010

(30) Foreign Application Priority Data
Mar. 5, 2007 (JP) .................. 2007-053622

(51) Int. Cl.
*C08L 63/10* (2006.01)
(52) U.S. Cl.
USPC ........... 525/488; 525/502; 525/504; 525/524; 525/525; 525/526; 525/527; 525/531
(58) Field of Classification Search
None
See application file for complete search history.

(56) References Cited

U.S. PATENT DOCUMENTS

| | | | |
|---|---|---|---|
| 4,925,773 A | 5/1990 | Miyamura et al. | |
| 5,009,982 A | 4/1991 | Kamayachi et al. | |
| 7,786,225 B2 * | 8/2010 | Yasumura et al. | 525/530 |
| 2006/0240198 A1 * | 10/2006 | Tanikawa et al. | 428/1.53 |
| 2007/0141507 A1 | 6/2007 | Sakata et al. | |

FOREIGN PATENT DOCUMENTS

| | | | | |
|---|---|---|---|---|
| JP | 61-243869 | | | 10/1986 |
| JP | 63-258975 | | | 10/1988 |
| JP | 09-188745 | | | 7/1997 |
| JP | 9-211860 | A | * | 8/1997 |
| JP | 2000-109541 | | | 4/2000 |
| JP | 2000-330275 | A | * | 11/2000 |
| JP | 2000-355621 | | | 12/2000 |
| JP | 2001-114866 | | | 4/2001 |
| JP | 2001-310927 | | | 11/2001 |
| JP | 2001-350260 | | | 12/2001 |
| JP | 2002-138131 | | | 5/2002 |
| JP | 2002-293876 | | | 10/2002 |
| JP | 2005-55814 | A | * | 3/2005 |
| JP | 2005-194504 | | | 7/2005 |
| JP | 2005-301249 | | | 10/2005 |
| JP | 2005-301249 | A | * | 10/2005 |
| JP | 2007-206421 | | | 8/2007 |
| JP | 2007-206421 | A | * | 8/2007 |
| WO | WO 2004/106314 | A1 | * | 12/2004 |

OTHER PUBLICATIONS

Imai et al., "Novel Chiral Bisoxazoline Ligands with a Biphenyl Backbone: Preparation, Complexation, and Application in Asymmetric Catalytic Reactions," Journal of Organic Chemistry, vol. 65, 2000, pp. 3326-3333.*
PubChem, benzidine, 2013, one page.*
International Search Report issued Apr. 8, 2008 in International (PCT) Application No. PCT/JP2008/053831, filed Mar. 4, 2008.

* cited by examiner

*Primary Examiner* — Robert Sellers
(74) *Attorney, Agent, or Firm* — Wenderoth, Lind & Ponack, L.L.P.

(57) ABSTRACT

A solder resist having both adequate sensitivity at photo-irradiation and alkali developability, and the solder resist forming a cured product which is excellent in dimensional stability against temperature change, does not exhibit brittleness, and further, is excellent in water resistance, electrical insulation, thermal cycle test resistance (TCT resistance) and the like is provided, and further, a dry film having a solder resist layer, a cured product and a printed wiring board are provided. The solder resist comprising an acid-modified vinyl ester synthesized from an epoxy compound, a phenol compound, an unsaturated monobasic acid and a polybasic acid anhydride, wherein the epoxy compound contains a crystalline epoxy resin having a melting point of 90° C. or more, and the phenol compound contains a compound having a bisphenol S structure.

10 Claims, No Drawings

SOLDER RESIST, DRY FILM THEREOF, CURED PRODUCT, AND PRINTED WIRING BOARD

TECHNICAL FIELD

The present invention relates to a solder resist useful for a printed wiring board.

BACKGROUND ART

A photosensitive resin composition for image-forming has been largely used for applications such as various resist materials associated with electrical parts, printing boards and the like, since the resin composition enables a fine processing by applying a principal of a photographic method (photolithography) and can provide a cured product excellent in physical properties to form an image. There are a solvent development type and an alkali development type in the photosensitive resin composition for image-forming, and in recent years, the alkali development type which is capable of development with a diluted weak alkaline solution has become a mainstream from the viewpoint of an environmental protection and the alkali development type photosensitive resin composition is used also in, for example, production of a printed wiring substrate, production of a liquid crystal display board, printing plate making, and the like.

In the case that the photosensitive resin composition for image-forming is used in a process of a photographic method (photolithography) as, for example, a resin composition for a liquid development type solder resist, sequential steps of coating the resin composition on a substrate firstly, subsequently heat-drying to form a coating film, then applying a pattern forming film on the coating film, photo-irradiating and developing are employed. In such steps, when the coating film remains to have an adhesion after heat-drying, there have been problems such that a part of resist is adhered to the pattern forming film after peeling and an accurate pattern cannot be produced or the pattern forming film cannot be peeled. Therefore, a tack free property after forming the coating film is an important demanded characteristic of the liquid development type resist.

In addition, photosensitivity at photo-irradiation and developability after photo-irradiation are also important demanded characteristics. That is, in order to form a fine pattern with high reliability and good reproducibility, a portion cured by photo-irradiation is not allowed to be eroded with a developer in development, and on the contrary, an unexposed portion has to be readily removed in development.

Further, the cured portion is required to have characteristics such as heat resistance durable for a high temperature treatment to be subsequently carried out (soldering step and the like in the case of a solder resist) and long term reliability of water resistance, humidity resistance and the like.

As a solder resist satisfying the above described characteristics to some extent, a carboxyl group-containing epoxy (meth)acrylate introduced with a carboxyl group by reacting an acid anhydride with epoxy(meth)acrylate obtained by reacting an epoxy resin and (meth)acrylic acid has been known (for example, Patent Documents 1 and 2). This carboxyl group-containing epoxy(meth)acrylate satisfies conflicting characteristics such as tack free property, photosensitivity and developability with good balance, and in addition, has a good important characteristics such as heat resistance and water resistance required for a cured product, comparatively. However, characteristics of a higher level are required along with progress of technology, and for example, it is required not to deteriorate the accuracy of patterns which are miniaturized more and more and required to be a small dimensional change (low coefficient of linear expansion) against temperature change in order to improve crack resistance by meeting a coefficient of linear expansion to that of a substrate.

For the above described epoxy(meth)acrylate, it is considered that introducing a large number of double bonds in a resin structure using a multifunctional epoxy resin and (meth) acrylate to enhance a crosslinking density for the improvement of heat resistance and dimensional stability. However, since enhancing the crosslinking density results in becoming a cured coating film brittle, there is a problem that a balance between heat resistance and reduction in brittleness is hardly obtained. Regarding the reduction in brittleness, a technique of using a mixture of a bisphenol type carboxyl group-containing epoxy(meth)acrylate and a novolac type carboxyl group-containing epoxy(meth)acrylate is disclosed (Patent Document 3), however, flexibility is emphasized as described that the mixture can be applied to also a flexible wiring substrate, and there is a possibility to improve dimensional stability against temperature change and water resistance.

Patent Document 1: Japanese Unexamined Patent Publication (JP-A) No. 61-243869
Patent Document 2: Japanese Unexamined Patent Publication (JP-A) No. 63-258975
Patent Document 3: Japanese Unexamined Patent Publication (JP-A) No. 2000-109541

DISCLOSURE OF THE INVENTION

Therefore, an object of the present invention is to provide a solder resist having both adequate sensitivity at photo-irradiation and alkali developability and the solder resist forming a cured product which is excellent in dimensional stability against temperature change, does not exhibit brittleness, and further, is excellent in water resistance, electrical insulation, thermal cycle test resistance (TCT resistance) and the like, and to provide a dry film having a solder resist layer, a cured product and a printed wiring board.

The present invention which achieves the above described object provides a solder resist comprising an acid-modified vinyl ester synthesized from an epoxy compound, a phenol compound, an unsaturated monobasic acid and a polybasic acid anhydride, wherein the epoxy compound contains a crystalline epoxy resin having a melting point of 90° C. or more, and the phenol compound contains a compound having a bisphenol S structure.

The crystalline epoxy resin preferably has a biphenyl structure. In addition, a use amount of the phenol compound is preferably 0.3 mol or more and 0.8 mol or less relative to 1 mol of the epoxy compound in the above solder resist.

The solder resist of the present invention may further comprise an epoxy acrylate, and it is preferable that the epoxy acrylate contains a carboxyl group-containing epoxy acrylate since alkali developability is improved. In addition, the solder resist of the present invention may comprise a compound having two or more functional groups reactable with a carboxyl group in one molecule, and it is more preferable that this compound has a biphenyl structure.

The present invention also includes an acid-modified vinyl ester for the solder resist.

Further, the present invention also includes a dry film comprising a solder resist layer obtained by coating the solder resist on a carrier film and drying, and a cured product obtained by curing the solder resist or the solder resist layer of the dry film.

Furthermore, the present invention also includes a printed wiring board comprising a protective film obtained by curing the solder resist or the solder resist layer of the dry film of the present invention on a circuit substrate having a conductor layer of a given circuit pattern.

Since the solder resist of the present invention has both alkali developability and photo curability, and further, contains an acid-modified vinyl ester which gives a cured product being excellent in dimensional stability against temperature change and not exhibiting brittleness as a resin component, physical properties of the cured product can be excellent. Therefore, the solder resist can be preferably used as a resist ink for a printed wiring board capable of alkali development.

Moreover, since the dry film, the cured product and the printed wiring board of the present invention are obtained from the above described solder resist, they are excellent not only in the above described characteristics but also in water resistance, electrical insulation, thermal cycle resistance (TCT resistance) and the like.

DESCRIPTION OF EMBODIMENTS

The present invention will be specifically described in the following.

A solder resist of the present invention comprises an acid-modified vinyl ester synthesized from an epoxy compound, a phenol compound, an unsaturated monobasic acid and a polybasic acid anhydride, wherein the epoxy compound contains a crystalline epoxy resin having a melting point of 90° C. or more, and the phenol compound contains a compound having a bisphenol S structure.

In general, a vinyl ester is obtained by reacting a carboxyl group of an unsaturated monobasic acid with an epoxy group of an epoxy compound, and this reaction allows introducing a double bond which acts as a crosslinking point at the time of curing. On the other hand, in the present invention, since the vinyl ester having a longer distance between double bonds than a distance between epoxy groups of the epoxy compound of a starting material is synthesized and used as one component of a resin composition, a cured product have flexibility, resulting in improving bending resistance and temperature cycle crack property.

Meanwhile, imparting flexibility to the cured product by lengthening the distance between double bonds causes reduction in a glass transition temperature and a coefficient of linear expansion due to decrease of a cross linking density, however, in the present invention, introducing a rigid structure derived from the epoxy compound having a high melting point into the vinyl ester raises a glass transition temperature and extends a range of a glass region temperature to which a low coefficient of linear expansion is applied, resulting in improving dimensional stability.

That is, a preferable acid-modified vinyl ester in the present invention is synthesized from an epoxy compound, a phenol compound, an unsaturated monobasic acid and a polybasic acid anhydride, wherein the epoxy compound contains a crystalline epoxy resin having a melting point of 90° C. or more, and the phenol compound contains a compound having a bisphenol S structure.

In obtaining the acid-modified vinyl ester of the present invention, it is essential to use a crystalline epoxy resin having a melting point of 90° C. or more as at least a part of the epoxy compound. The crystalline epoxy resin preferably has a melting point of 95° C. or more, and more preferably a melting point of 100° C. or more.

Examples of the crystalline epoxy resin include epoxy resins having a biphenyl structure, a phenylene structure, a sulfide structure or the like. Among them, a bifunctional crystalline epoxy resin is preferable, and specific examples thereof include a commercially available product thereof include YL6121H, YX4000 (made by Japan Epoxy Resins Co., Ltd.) and YDC-1312, YSLV-120TE, YSLV-90CR (made by Tohto Kasei Co., Ltd.) and the like, and these may be used either alone or as a combination of at least two of them. An epoxy resin having a biphenyl structure is more preferable, and such an epoxy resin includes the above described YL6121H, YX4000 and the like.

Other known epoxy compounds may be used in combination as the epoxy compound, and examples of such an epoxy compound include bisphenol type epoxy resins such as bisphenol A type, tetrabromobisphenol A type, bisphenol F type, and bisphenol S type; alicyclic epoxy resins such as hydrogenated (hydrogenised) bisphenol A type; diglycidyl ester type epoxy resins; and diglycidyl ether type epoxy resins of a polyvalent alcohol, and in particular, diglycidyl ether type epoxy resins obtained by reacting epichlorohydrin with polyalkylene glycols such as polyethylene glycol, polypropylene glycol, and polytetramethylene glycol, or with a divalent alcohols obtained by adding alkylene oxide to a bisphenol compound that is a precursor of the above described bisphenol type epoxy resin; bifunctional epoxy compounds such as a diglycidyl amine type epoxy resin, and a multifunctional glycidyl amine resin such as tetraglycidyl aminodiphenylmethane; a multifunctional glycidyl ether resin such as tetraphenylglycidyl ether ethane; a phenol novolac type epoxy resin and a cresol novolac type epoxy resin; a reaction product of epichlorohydrin with polyphenol compounds obtained by a condensation reaction of phenol compounds such as phenol, o-cresol, m-cresol and naphthol with a phenolic hydroxyl group-containing aromatic aldehyde; a reaction product of epichlorohydrin with a polyphenol compound obtained by an addition reaction of a phenol compound and a diolefin compound such as divinyl benzene and dicyclopentadiene; a reaction product obtained by epoxylation a ring opening polymer of 4-vinylcyclohexene-1-oxide with a peracid; and an epoxy compound having trifunctionality or more such as an epoxy resin having a heterocyclic ring such as triglycidyl isocyanurate.

Herein, in the case of using an epoxy compound other than the crystalline epoxy resin having a melting point of 90° C. or more together, a use amount thereof is preferably 75 mol % or less when the entire epoxy compound is assumed to be 100 mol %. In the case of using more than 75 mol %, rigidity derived from the structure of the crystalline epoxy compound having a high melting point may be insufficient, resulting in insufficiently obtaining the effect of improving dimensional stability of a cured product. The use amount of the epoxy compound is preferably 50 mol % or less, and more preferably 25 mol % or less.

In the present invention, a compound having a bisphenol S structure is used as at least a part of the phenol compound. Examples of the phenol compound having a bisphenol S structure include bisphenol S, tetrabromobisphenol S, tetramethyl bisphenol S and the like, and these may be used either alone or as a combination of at least two of them. Among them, bisphenol S is preferable from the viewpoint of availability.

In addition, a known bifunctional phenol compound having no bisphenol S structure may be used in combination as the phenol compound, and examples of such a phenol compound include known bisphenols except for bisphenol S such as bisphenol A, bisphenol F, 9,9-bis(4-hydroxyphenyl)fluorene, and bis(4-hydroxyphenyl)sulfide; and biphenol. Further, a phenol compound having trifunctionality or more functionality may be partly used in combination, and examples thereof include a novolac resin, 1,1,1-tris(4-hydroxyphenyl)ethane and the like.

Herein, in the case of using the phenol compound having no bisphenol S structure together, a use amount thereof is preferably 75 mol % or less when the entire phenol compound is assumed to be 100 mol %. In the case of using more than 75 mol %, a coagulation effect derived from a bisphenol S structure is in short, resulting in insufficiently obtaining the effect of improving dimensional stability of a cured product. The use amount of the phenol compound having no bisphenol S structure is preferably 50 mol % or less, and more preferably 25 mol % or less.

The unsaturated monobasic acid used in the present invention means a monobasic acid having one carboxyl group and one or more radical polymerizable unsaturated bonds. Specific examples thereof include acrylic acid, methacrylic acid, crotonic acid, cinnamic acid, β-acryloxypropionic acid, a reaction product of hydroxyalkyl(meth)acrylate having one hydroxyl group and one (meth)acryloyl group and dibasic acid anhydride, a reaction product of dibasic acid anhydride and multifunctional (meth)acrylate having one hydroxyl group and two or more (meth)acryloyl groups, caprolactone-modified products of these monobasic acid and the like, and these may be used either alone or as a combination of at least two of them. Among them, compounds having a (meth)acryloyl group such as acrylic acid and methacrylic acid are particularly preferable.

Methods of conducting a synthesis reaction of the vinyl ester (before reacting with polybasic acid anhydride) in the present invention include:
a method of depositing the phenol compound, the epoxy compound and the unsaturated monobasic acid at once, and synthesizing wholly;
a method of carrying out a chain extension reaction of the phenol compound and the epoxy compound firstly, and subsequently reacting the unsaturated monobasic acid therewith;
and the like.

Herein, it is preferable to deposit compounds so that a total amount of a phenolic hydroxyl group of the phenol compound and a carboxyl group of the unsaturated monobasic acid is 0.8 to 1.2 equivalents relative to 1 equivalent of an epoxy group of the epoxy compound and proceed the reaction.

The vinyl ester in the present invention obtained by the above described method has a double bond equivalent (molecular weight per 1 chemical equivalent of a radical polymerizable double bond) of preferably at least 400 g/eq, and more preferably at least 450 g/eq, and further more preferably at least 500 g/eq. Therefore, a use amount of the phenol compound is preferably 0.3 mol or more relative to 1 mol of the epoxy compound, more preferably 0.35 mol or more, and further more preferably 0.4 mol or more. Using in the range of the lower limits or more realizes a more appropriate distance between crosslinking points, resulting in improving flexibility of a cured product.

Also, an upper limit of the double bond equivalent is preferably 7000 g/eq, and more preferably 6000 g/eq, and further more preferably 5000 g/eq. Therefore, a use amount of the phenol compound is preferably 0.8 mol or less relative to 1 mol of the epoxy compound, more preferably 0.7 mol or less, and further more preferably 0.6 mol or less. Using in the range of the upper limits or less realizes control of a molecular weight and sufficient fluidity in the presence or absence of a diluent such as a radical polymerizable monomer and a solvent described below, resulting in easier handling in production or coating operation.

Conditions of the synthesis reaction of the vinyl ester are not particularly limited, however, the synthesis reaction may be conducted generally at in the range of 80° C. to 150° C. in the presence or absence of a diluent such as a radical polymerizable monomer and a solvent described below, in coexistence with a polymerization inhibitor such as hydroquinone and oxygen and with a reaction catalyst including a tertiary amine such as triethylamine, a quaternary ammonium salt such as triethylbenzyl ammonium chloride, an imidazole compound such as 2-ethyl-4-methylimidazole, a tertiary phosphine such as triphenyl phosphine, a quaternary phosphonium salt such as benzyltriphenylphosphonium bromide, and an organic acid or inorganic salt of a metal or a chelate compound thereof.

The vinyl ester obtained in the above contains an alcoholic hydroxyl group generated by ring opening of an epoxy group in the reaction of an epoxy group of the epoxy compound with the phenolic hydroxyl group or the unsaturated monobasic acid. The acid-modified vinyl ester used for the solder resist of the present invention capable of alkali development is obtained by introducing a carboxyl group by addition reacting the polybasic acid anhydride to these hydroxyl groups. Examples of the polybasic acid anhydride include dibasic acid anhydrides such as phthalic anhydride, succinic anhydride, octenyl succinic anhydride, pentadodecenyl succinic anhydride, maleic anhydride, tetrahydrophthalic anhydride, hexahydrophthalic anhydride, methyltetrahydrophthalic anhydride, 3,6-endomethylenetetrahydrophthalic anhydride, methylendomethylenetetrahydrophthalic anhydride, tetrabromophthalic anhydride, and a reaction product of 9,10-dihydro-9-oxa-10-phosphaphenanthrene-10-oxide and itaconic anhydride or maleic anhydride; trimellitic anhydride; aliphatic or aromatic tetrabasic dianhydrides such as biphenyl tetracarboxylic dianhydride, naphthalene tetracarboxylic dianhydride, diphenyl ether tetracarboxylic dianhydride, butanetetracarboxylic dianhydride, cyclopentanetetracarboxylic dianhydride, pyromellitic anhydride, and benzophenone tetracarboxylic dianhydride, and these may be used either alone or as a combination of at least two of them.

A solvent used in the addition reaction is not particularly limited, and any solvent that used in vinyl ester synthesis can be used. Industrially, it is simple and easy to conduct vinyl ester synthesis followed by the addition reaction by adding the polybasic acid anhydride in a reaction solution.

A catalyst may be used in the addition reaction according to necessity. Specific examples of the catalyst include a tertiary amine such as triethylamine, a quaternary ammonium salt such as triethylbenzyl ammonium chloride, an imidazole compound such as 2-ethyl-4-methylimidazole, a phosphor compound such as triphenyl phosphine and tetraphenylphosphonium bromide, a carboxylic acid metal salt such as lithium acetate, and an inorganic metal salt such as lithium carbonate.

The reaction of the polybasic acid anhydride is preferably conducted so that an acid anhydride group of the polybasic acid anhydride is 0.1 mol to 1.1 mol relative to 1 chemical equivalent of a hydroxyl group of the vinyl ester, and more preferably 0.2 mol to 0.9 mol. In order to enables favorable alkali developability using a weak alkaline aqueous solution, the acid-modified vinyl ester preferably has an acid value of 30 mgKOH/g or more, and a more preferably 50 mgKOH/g. Also, the upper limit of the acid value is preferably 150 mgKOH/g, and more preferably 120 mgKOH/g. A reaction temperature is preferably in the range of 60° C. to 150° C., and more preferably in the range of 80° C. to 120° C.

The acid-modified vinyl ester is mixed with a known radical polymerizable compound, and the resulting is used as the solder resist in the present invention. The radical polymerizable compound includes a radical polymerizable resin and a radical polymerizable monomer. As the radial polymerizable resin, an unsaturated polyester, an epoxy acrylate, an urethane acrylate, a polyester acrylate and the like can be used. In using these radical polymerizable resins, the radical polymerizable resin is preferably used in an amount of 90 mass % or less when a resin solid content (a total amount of the acid-modified vinyl ester and a solid content of the radical polymerizable resin) is assumed to be 100 mass %, in order to realize improving effects of flexibility, heat resistance and the like derived from the acid-modified vinyl ester used as one of the resin components of the solder resist of the present invention. A more preferable upper limit is 80 mass %, and a further more preferable upper limit is 75 mass %.

Among the radical polymerizable resins, in particular, an epoxy acrylate is preferably used as the resin component of the solder resist of the present invention, since it is excellent in photopolymerization, effective for improving characteristics of a cured product to be obtained, and further, excellent in blending property with the acid-modified vinyl ester. A reaction product of a known epoxy resin having two or more epoxy groups in one molecule and an unsaturated monobasic acid ((meth)acrylic acid, and the like) may be directly used as the epoxy acrylate.

In the case of adopting the method of carrying out a chain extension reaction of the phenol compound and the epoxy compound firstly, and subsequently reacting the unsaturated monobasic acid therewith among the methods of synthesis of the vinyl ester in the present invention, the vinyl ester and the epoxy acrylate can be obtained simultaneously by reacting the unsaturated monobasic acid with a mixture of a product obtained by the chain extension reaction of the phenol compound and the epoxy compound and an epoxy resin which is a starting material of the epoxy acrylate.

In this case, one or more kinds of a phenol compound having a long chain alkyl group, an aromatic ring-containing substituent group, an alcoholic hydroxyl group or the like, and a monobasic acid without having an ethylenical unsaturated double bond such as acetic acid, propionic acid and dimethylol propionic acid may be used in combination with the unsaturated monobasic acid. A kind and used amount thereof are suitably selected according to demand characteristics such as physical properties of a cured product.

Further, a carboxyl group-containing epoxy acrylate obtained by addition reacting the above described polybasic acid anhydride to a hydroxyl group contained of an epoxy acrylate may be also used for the epoxy acrylate, resulting in maintaining alkali developability in a high level. The reaction of the epoxy acrylate and the polybasic acid anhydride can be conducted by the same manner as the above described reaction of the vinyl ester and the polybasic acid anhydride, that is, the reaction of addition reacting the polybasic acid anhydride with an alcoholic hydroxyl group generated by ring opening of an epoxy group in the reaction of an epoxy group of the epoxy compound with the phenolic hydroxyl group or the unsaturated monobasic acid to produce a carboxy group-introduced acid-modified vinyl ester. Also, a polybasic acid anhydride may be reacted with a mixture of a vinyl ester and an epoxy acrylate to obtain the acid-modified vinyl ester and a carbonyl group-containing epoxy acrylate simultaneously.

The epoxy resin as a starting material of the epoxy acrylate is preferably an epoxy resin having three or more epoxy groups in one molecule, and is more preferably a novolac type epoxy resin. In particular, using a novolac type epoxy resin having a softening point of 75° C. or more is preferable from the viewpoint of tack free property in forming a coating film by heat drying.

As the radical polymerizable monomer among the radical polymerizable compound, both of a mono functional monomer (having one double bond capable of radical polymerization) and a multifunctional monomer (having two or more double bonds capable of radical polymerization) can be used. The radical polymerizable monomer is associated with photopolymerization and improves characteristics of a cured product to be obtained, and further, controls a viscosity of the resin composition. In the case of using the radical polymerizable monomer, a use amount thereof is preferable 5 parts by mass to 500 parts by mass (more preferably 10 parts by mass to 100 parts by mass) relative to 100 parts by mass of a resin solid content (total amount of the acid-modified vinyl ester of the present invention and a solid content of the radical polymerizable resin).

Specific examples of the radical polymerizable monomer include N-substituted maleimide group-containing monomers such as N-phenylmaleimide, N-(2-methylphenyl)maleimide, N-(4-methylphenyl)maleimide, N-(2,6-diethylphenyl)maleimide, N-(2-chlorophenyl)maleimide, N-methylmaleimide, N-ethylmaleimide, N-isopropylmaleimide, N-laurylmaleimide, N-cyclohexylmaleimide, N-phenylmethylmaleimide, N-(2,4,6-tribromophenyl)maleimide, N-[3-(triethoxysilyl)propyl]maleimide, N-octadecenylmaleimide, N-dodecenylmaleimide, N-(2-methoxyphenyl)maleimide, N-(2,4,6-trichlorophenyl)maleimide, N-(4-hydroxyphenyl)maleimide, and N-(1-hydroxyphenyl)maleimide; aromatic vinyl based monomers such as styrene, α-methylstyrene, α-chlorostyrene, vinyl toluene, p-hydroxystyrene, divinylbenzene, diallyl phthalate, and diallylbenzene phosphonate; vinyl ester monomers such as vinyl acetate, and vinyl adipate; (meth)acrylic monomers such as meth(acrylic) acid, methyl(meth)acrylate, ethyl(meth)acrylate, butyl(meth) acrylate, 2-hydroxyethyl(meth)acrylate, 3-hydroxypropyl (meth)acrylate, 2-hydroxypropyl(meth)acrylate, 4-hydroxybutyl(meth)acrylate, 4-hydroxymethyl(meth)acrylamide, pentaerythritol mono(meth)acrylate, dipentaerythritol mono (meth)acrylate, trimethylol propane mono(meth)acrylate, 1,6-hexanediol mono(meth)acrylate, glycerol mono(meth) acrylate, (di)ethyleneglycol di(meth)acrylate, propyleneglycol di(meth)acrylate, trimethylolpropane di(meth)acrylate, trimethylolpropane tri(meth)acrylate, pentaerythritol tetra (meth)acrylate, dipentaerythritol hexa(meth)acrylate, tris[2-(meth)acryloyloxyethyl]triazine, and dendritic acrylate; (hyrdoxy)alkylvinyl(thio)ethers such as n-propylvinyl ether, isopropylvinyl ether, n-butylvinyl ether, isobutylvinyl ether, n-hexylvinyl ether, cyclohexylvinyl ether, 2-ethylhexylvinyl ether, and 4-hydroxybutylvinyl ether; vinyl(thio)ethers having a radical polymerizable double bond such as (meth) acrylic 2-(vinyroxyethoxy)ethyl, (meth)acrylic 2-(isoprope-noxyethoxyethoxy)ethyl, (meth)acrylic 2-(isopropenoxyethoxyethoxyethoxy)ethyl, and (meth) acrylic 2-(isopropenoxyethoxyethoxyethoxyethoxy)ethyl; an acid anhydride group-containing monomer such as maleic anhydride or a monomer in which an acid anhydride group is ring-opening modified by alcohols, amines, water or the like; N-vinyl based monomers such as N-vinylpyrrolidone and N-vinyloxazolidone; and compounds having one or more double bonds capable of radical polymerization such as an allyl alcohol, and triallyl cyanurate. These are appropriately chosen according to uses and demand characteristics of a cured product, and these may be used either alone or as a mixture of at least two of them.

The solder resist of the present invention may comprise a compound having two or more functional groups reactable with a carboxyl group in one molecule. Accordingly, the solder resist can be cured by using light and heat in combination, resulting in obtaining a more rigid cured coating film. When used in a printed wiring board, heat treatment after photo-irradiation and alkali development enables to increase a crosslinking degree in the cured coating film with consuming a carboxyl group, resulting in further improving physical properties such as durability.

Examples of the compound having two or more functional groups reactable with a carboxyl group in one molecule include an epoxy compound, an oxazoline compound and an oxetane compounds. Specifically, examples of the epoxy compounds include a novolac type epoxy resin, a bisphenol type epoxy resin, an alicyclic epoxy resin and triglycidyl isocyanurate, and examples of the oxazoline compounds include 1,3-phenylene bisoxazoline.

Among them, compounds having a biphenyl structure, a bisphenol S structure, phenylene structure or a sulfide structure are preferable in order to improve characteristics of the acid-modified vinyl ester further. Specifically, epoxy resins such as YL6121H, YX4000, YDC-1312, YSLV-120TE, YSLV-90CR, which are described above as crystalline epoxy resins, and NC-3000, NC-3100, NC-3200 (made by Nippon Kayaku Co., Ltd.), and bisphenol S glycidyl ether are particularly preferable.

A use amount of these compounds is preferably 5 parts by mass to 70 parts by mass relative to 100 parts by mass of a total of a resin solid content (a total amount of the acid-modified vinyl ester of the present invention and a solid content of the radical polymerizable resin) and the radical polymerizable monomer, which is used according to necessity, and more preferably 10 parts by mass to 50 parts by mass. In this time, curing agents such as dicyandiamide and imidazole compounds may be used in combination.

The solder resist of the present invention may comprise a solvent from the viewpoints of workability and the like in coating the solder resist of the present invention on a substrate. Examples of the solvent include carbon hydrides such as toluene and xylene; cellosolves such as cellosolve and butyl cellosolve; carbitols such as carbitol and butyl carbitol; esters such as cellosolve acetate, carbitol acetate, (di)propylene glycol monomethyl ether acetate, (di)methyl glutarate, (di)methyl succinate and (di)methyl adipate; ketones such as methyl isobutyl ketone and methyl ethyl ketone; and ethers such as (di)ethylene glycol dimethyl ether, and these may be used either alone or as a mixture of at least two of them.

The solder resist of the present invention can be thermally cured by using a known heat polymerization initiator, however, the solder resist is preferably photo-cured by adding a photopolymerization initiator for fine processing and image formation by photolithography.

Known initiators can be used as the photopolymerization initiator, and examples of the photopolymerization initiator include benzoin or alkyl ethers thereof such as benzoin, benzoin methyl ether and benzoin ethyl ether; acetophenones such as acetophenone, 2,2-dimethoxy-2-phenylacetophenone, 1,1-dichloroacetophenone, and 4-(1-t-butyldioxy-1-methylethyl)acetophenone; anthraquinones such as 2-methyl anthraquinone, 2-amyl anthraquinone, 2-t-butyl anthraquinone, and 1-chloroanthraquinone; thioxanthones such as 2,4-dimethyl thioxanthone, 2,4-diisopropyl thioxanthone, and 2-chlorothioxanthone; ketals such as acetophenonedimethyl ketal, and benzyldimethyl ketal; and benzophenones such as benzophenone, 4-(1-t-butyldioxy-1-1-methylethyl)benzophenone, and 3,3',4,4'-tetrakis(t-butyldioxycarbonyl)benzophenone.

Further, preferable examples of the photopolymerization initiator include α-aminoacetophenones such as 2-methyl-1-[4-(methylthio)phenyl]-2-morpholinopropane-1,2-benzyl-2-dimethylamino-1-(4-morpholinophenyl)-butane-1-one, 2-(dimethylamino)-2-[(4-methylphenyl)methyl]-1-[4-(4-morpholinyl)phenyl]-1-butanone, N,N-dimethylaminoacetophenone (Irgacure (registered trademark) 907, Irgacure 369, Irgacure 379 and the like as commercially available products, those are all made by Ciba Specialty Chemicals K. K. (current Ciba Japan K.K.)); and acylphosphine oxides such as 2,4,6-trimethylbenzoyldiphenylphosphine oxide, bis (2,4,6-trimethylbenzoyl)-phenylphosphine oxide, and bis(2,6-dimethoxybenzoyl)-2,4,4-trimethyl-pentylphosphine oxide (Lucirin (registered trademark) TPO made by BASF Co., Irgacure 819 made by Ciba Specialty Chemicals K. K., and the like as commercially available products).

Examples of other preferable initiators include an oxime ester containing a structure of the following formula (I):

[Formula 1]

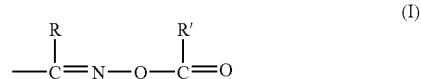

(I)

wherein R and R' are monovalent organic groups.

Specific examples of the oxime ester group include 2-(acetyloxyiminomethyl)thioxanthene-9-one, (1,2-octanedione, 1-[4-(phenylthio)phenyl]-, 2-(O-benzoyloxime)), and (ethanone, 1-[9-ethyl-6-(2-methylbenzoyl)-9H-carbazole-3-yl]-, 1-(O-acetyloxime)). Examples of commercially available products thereof include CGI-325, Irgacure OXE01, and Irgacure OXE02 made by Ciba Specialty Chemicals K. K., and N-1919 made by ADECA Co. These photopolymerization initiators are used either alone or as a mixture of at least two of them, are preferably contained in an amount of 0.2 parts by mass to 30 parts by mass relative to 100 parts by mass of a total of a resin solid content (a total amount of the acid-modified vinyl ester of the present invention and a solid content of the radical polymerizable resin) and the radical polymerizable monomer, which is used according to necessity. When the amount of the photopolymerization initiator is less than 0.2 part by mass, time for photo-irradiation has to increase or polymerization hardly occurs in spite of photo-irradiation, resulting in not obtaining suitable surface hardness. In addition, in the case of adding the photopolymerization initiator in an amount exceeding 30 parts by mass, there is no merit using such a large amount.

The solder resist of the present invention may further comprises fillers such as talc, clay, barium sulfate and silica, and known additives such as a coloring pigment, an antifoaming agent, a coupling agent, a leveling agent, a sensitizers, a mold release agent, a lubricant, an antioxidant, an ultraviolet absorbent, a flame retardant, a polymerization suppressing agent, and a tackifier according to necessity. Furthermore, various reinforced fibers can be used as fibers for reinforcement to obtain a fiber reinforced complex material.

For using the solder resist of the present invention, the solder resist is coated on a substrate, suitably dried (at about in the range of 60° C. to 120° C.), and then exposed to light via a pattern film and the like to obtain a cured coating film, and an unexposed portion is developed. In the development, solvent development may be conducted by using the above described solvent or a halogen solvent such as trichloroethylene, however, alkali development is preferably conducted because a carboxyl group is introduced in the acid-modified vinyl ester and the unexposed portion is dissolved in an alkaline aqueous solution. Specific examples of usable alkali include alkali metal compounds such as sodium carbonate, potassium carbonate, sodium hydroxide and potassium hydroxide; alkali earth metal compounds such as calcium hydroxide; ammonia; and water soluble organic amines such as monomethylamine, dimethylamine, trimethylamine, monoethylamine, diethylamine, triethylamine, monopropylamine, dimethylpropylamine, monoethanolamine, diethanolamine, triethanolamine, ethylenediamine, diethylenetriamine, dimethylaminoethyl methacrylate and polyethyleneimine, and these may be used either alone or as a combination of at least two of them.

After development, it is preferable to conduct a heat treatment at about in the range of 140° C. to 200° C. to thermally cure the coating film which has been photo-cured.

The solder resist of the present invention may be used in a form of a dry film having a solder resist layer formed by coating and drying the solder resist on a film of polyethylene terephthalate or the like in advance, besides by a method of directly coating the solder resist in a liquid form to a substrate. A method of using the solder resist of the present invention as a dry film is described in the following.

A dry film has a structure in which a carrier film, a solder resist layer, and a cover film capable of peeling, that is used according to necessity, are stacked in this order. The solder resist layer is a layer obtained by coating the solder resist on the carrier film or the cover film and drying. The dry film is obtained by forming the solder resist layer on the carrier film, followed by stacking the cover film thereon, or by forming the solder resist layer on the cover film and stacking the resulting laminate on the carrier film.

A thermoplastic film such as a polyester film having a thickness of 2 μm to 150 μm is used as the carrier film.

The solder resist layer is formed by coating the solder resist uniformly on the carrier film or the cover film in a thickness of 10 μm to 150 μm by a blade coater, a lip coater, a comma coater, a film coater, or the like, and then drying.

As the cover film, a polyethylene film, a polypropylene film or the like can be used, and a film having smaller adhesion force to the solder resist layer than that of the carrier film are preferable.

Preparation of a protective film (a permanent protective film) on a printed wiring board by using the dry film is conducted by peeling the cover film, laminating the solder resist layer and a substrate on which a circuit is formed, and sticking them together using a laminator or the like, thereby obtaining the solder resist layer on the substrate on which a circuit is formed. The formed solder resist layer is subjected to photo-irradiation, development, and heat curing in the same manner as described above, resulting in being formed a cured coating film. The carrier film may be peeled before or after the photo-irradiation.

In addition, a CTP (Computer To Plate) system which is largely used in a printing and plate making field recently, that is, a method of drawing by scanning and irradiating laser light directly on the coating film with digitalized data without using a pattern forming film at the time of irradiation can be used.

EXAMPLES

The present invention will be more specifically described by way of examples in the following, however, the following examples do not restrict the present invention, and all the modifications which do not depart from the objects of the invention are included in the technical scope of the invention.

Note that "part" indicates "part by mass", and "%" indicates "mass %" in the description below as otherwise particularly noticed.

Synthesis Example 1

Synthesis of an Acid-Modified Vinyl Ester (A-1)

Into a container equipped with a stirring device, a thermometer, a reflux condenser and a gas introduction tube, 188 parts of a biphenyl type epoxy resin (trade name "YX4000"; made by Japan Epoxy Resins Co., Ltd.; epoxy equivalent 188, melting point about 107° C.), 62.6 parts of bisphenol S, 244.3 parts of propylene glycol monomethyl ether acetate, and 0.3 part of benzyltriethyl ammonium chloride as a reaction catalyst were added and reacted at 140° C. for 6 hours to confirm completion of the reaction of a phenolic hydroxyl group and an epoxy group by the quantification of an epoxy group. Subsequently, 43.5 parts of methacrylic acid, 0.9 part of triphenylphosphine as an esterification catalyst, and 0.4 part of methylhydroquinone as a polymerization inhibitor were added and reacted at 120° C. for 20 hours to confirm that an acid value of the reaction product was 1.9 mgKOH/g. Then, 88.1 parts of tetrahydrophthalic anhydride was added and reacted at 110° C. for 5 hours while stirring. As a result, a propylene glycol monomethyl ether acetate solution containing 61% of an acid-modified vinyl ester (A-1) having an acid value of 89 mgKOH/g was obtained.

Synthesis Example 2

Synthesis of an Acid-Modified Vinyl Ester (A-2)

Into a container equipped with a stirring device, a thermometer, a reflux condenser and a gas introduction tube, 172 parts of a biphenyl type epoxy resin (trade name "YL6121H"; made by Japan Epoxy Resins Co., Ltd.; epoxy equivalent 172, melting point about 130° C.), 62.5 parts of bisphenol S, 235.2 parts of propylene glycol monomethyl ether acetate, and 0.3 part of benzyltriethyl ammonium chloride as a reaction catalyst were added and reacted at 140° C. for 5 hours to confirm completion of the reaction of a phenolic hydroxyl group and an epoxy group by the quantification of an epoxy group. Subsequently, 43.5 parts of methacrylic acid, 0.8 part of benzyltriphenyl phosphonium chloride as an esterification catalyst, and 0.4 part of methylhydroquinone as a polymerization inhibitor were added and reacted at 120° C. for 20 hours to confirm that an acid value of the reaction product was 1.6 mgKOH/g. Then, 89.8 parts of tetrahydrophthalic anhydride was added and reacted at 110° C. for 6 hours while stirring. As a result, a propylene glycol monomethyl ether acetate solution containing 61% of an acid-modified vinyl ester (A-2) having an acid value of 94 mgKOH/g was obtained.

Synthesis Example 3

Batch Synthesis of a Mixture (A-3) of an Acid-Modified Vinyl Ester and a Carboxyl Group-Containing Novolac Type Epoxy Acrylate Into a container equipped with a stirring device, a thermometer, a reflux condenser and a gas introduction tube, 85 parts of the biphenyl type epoxy resin "YX4000" which was the same as used in Synthesis Example 1, 28.3 parts of bisphenol S, 189.3 parts of propylene glycol monomethyl ether acetate, and 0.5 part of benzyltriethyl ammonium chloride as a reaction catalyst were added and reacted at 140° C. for 6 hours to confirm completion of the reaction of a phenolic hydroxyl group and an epoxy group by the quantification of an epoxy group, and then, 231 parts of a cresol novolac type epoxy resin (trade name "EOCN-104S"; made by Nippon Kayaku Co., Ltd.; epoxy equivalent 219) and 189.3 parts of propylene glycol monomethyl ether acetate were added and dissolved to form a homogeneous solution. Subsequently, 111.4 parts of methacrylic acid, 1.4 parts of triphenylphosphine as an esterification catalyst, and 0.6 part of methylhydroquinone as a polymerization inhibitor were added and reacted at 120° C. for 20 hours to confirm that an acid value of the reaction product was 2.9 mgKOH/g. Then, 136.5 parts of tetrahydrophthalic anhydride was added and reacted at 110° C. for 5 hours to obtain a propylene glycol monomethyl ether acetate solution containing 61% of a mixture (A-3) of an acid-modified vinyl ester having an acid value of 90 mgKOH/g and a carboxyl group-containing novolac type epoxy acrylate.

Synthesis Example 4

Batch Synthesis of a Mixture (A-4) of an Acid-Modified Vinyl Ester and a Carboxyl Group-Containing Novolac Type Epoxy Acrylate Into a container equipped with a stirring device, a thermometer, a reflux condenser and a gas introduction tube, 75.2 parts of the biphenyl type epoxy resin "YX4000" which was the same as used in Synthesis Example 1, 25 parts of bisphenol S, 127.4 parts of propylene glycol monomethyl ether acetate, and 0.3 part of benzyltriethyl ammonium chloride as a reaction catalyst were added and reacted at 140° C. for 5 hours to confirm completion of the reaction of a phenolic hydroxyl group and an epoxy group by the quantification of an epoxy group, and then, 131.4 parts of the cresol novolac type epoxy resin "EOCN-104S" which was the same as used in Synthesis Example 3 and 127.4 parts of propylene glycol monomethyl ether acetate were added and dissolved to form a homogeneous solution. Subsequently, 69.6 parts of methacrylic acid, 0.9 part of benzyltriphenyl phosphonium chloride as an esterification catalyst, and 0.4 part of methylhydroquinone as a polymerization inhibitor were added and reacted at 120° C. for 20 hours to confirm that an acid value of the reaction product was 2.4 mgKOH/g. Then, 97.3 parts of tetrahydrophthalic anhydride was added and reacted at 110° C. for 6 hours to obtain a propylene glycol monomethyl ether acetate solution containing 61% of a mixture (A-4) of an acid-modified vinyl ester having an acid value of 95 mgKOH/g and a carboxyl group-containing novolac type epoxy acrylate.

Synthesis Example 5

Batch Synthesis of a Mixture (A-5) of an Acid-Modified Vinyl Ester and a Carboxyl Group-Containing Bisphenol a Type Epoxy Acrylate Into a container equipped with a stirring device, a thermometer, a reflux condenser and a gas introduction tube, 130 parts of the biphenyl type epoxy resin "YX4000" which was the same as used in Synthesis Example 1, 43.3 parts of bisphenol S, 182.7 parts of propylene glycol monomethyl ether acetate, and 0.4 part of benzyltriethyl ammonium chloride as a reaction catalyst were added and reacted at 140° C. for 6 hours to confirm completion of the reaction of a phenolic hydroxyl group and an epoxy group by the quantification of an epoxy group, and then, 176.3 parts of a bisphenol A type epoxy resin (trade name "jER834"; made by Japan Epoxy Resins Co., Ltd.; epoxy equivalent 255) and 182.7 parts of propylene glycol monomethyl ether acetate were added and dissolved to form a homogeneous solution. Subsequently, 90.2 parts of methacrylic acid, 1.3 parts of triphenylphosphine as an esterification catalyst, and 0.6 part of methylhydroquinone as a polymerization inhibitor were added and reacted at 120° C. for 20 hours to confirm that an acid value of the reaction product was 2.9 mgKOH/g. Then, 131.7 parts of tetrahydrophthalic anhydride was added and reacted at 110° C. for 5 hours to obtain a propylene glycol monomethyl ether acetate solution containing 61% of a mixture (A-5) of an acid-modified vinyl ester having an acid value of 90 mgKOH/g and a carboxyl group-containing bisphenol A type epoxy acrylate.

Synthesis Example 6

Batch Synthesis of a Mixture (A-6) of an Acid-Modified Vinyl Ester and a Carboxyl Group-Containing Novolac Type Epoxy Acrylate Into a container equipped with a stirring device, a thermometer, a reflux condenser and a gas introduction tube, 70 parts of a phenylene type epoxy resin (trade name "YDC-1312"; made by Tohto Kasei Co., Ltd.; epoxy equivalent 175.1, melting point about 142° C.), 25 parts of bisphenol S, 125.2 parts of propylene glycol monomethyl ether acetate, and 0.3 part of benzyltriethyl ammonium chloride as a reaction catalyst were added and reacted at 140° C. for 5 hours to confirm completion of the reaction of a phenolic hydroxyl group and an epoxy group by the quantification of an epoxy group, and then, 131.4 parts of the cresol novolac type epoxy resin "EOCN-104S" which was the same as used in Synthesis Example 3 and 125.2 parts of propylene glycol monomethyl ether acetate were added and dissolved to form a homogeneous solution. Subsequently, 69.6 parts of methacrylic acid, 0.9 part of benzyltriphenyl phosphonium chloride as an esterification catalyst, and 0.4 part of methylhydroquinone as a polymerization inhibitor were added and reacted at 120° C. for 20 hours to confirm that an acid value of the reaction product was 1.6 mgKOH/g. Then, 95.6 parts of tetrahydrophthalic anhydride was added and reacted at 110° C. for 5 hours to obtain a propylene glycol monomethyl ether acetate solution containing 61% of a mixture (A-6) of an acid-modified vinyl ester having an acid value of 94 mgKOH/g and a carboxyl group-containing novolac type epoxy acrylate.

Synthesis Example 7

Synthesis of a Carboxyl Group-Containing Epoxy Acrylate (Novolac Type, B-1)

Into a container equipped with a stirring device, a thermometer, a reflux condenser and a gas introduction tube, 219 parts of the cresol novolac type epoxy resin "EOCN-104S" which was the same as used in Synthesis Example 3, 87 parts of methacrylic acid, 258.8 parts of propylene glycol monomethyl ether acetate, 0.9 part of benzyltriphenyl phosphonium chloride as an esterification catalyst, and 0.4 part of methylhydroquinone as a polymerization inhibitor were added and reacted at 120° C. for 20 hours to confirm that an acid value of the reaction product was 3 mgKOH/g. Then, 98.8 parts of tetrahydrophthalic anhydride and 0.3 part of benzyltriethyl ammonium chloride as an esterification catalyst were added and reacted at 110° C. for 4 hours to obtain a propylene glycol monomethyl ether acetate solution containing 61% of a carboxyl group-containing epoxy acrylate (B-1) having an acid value of 96 mgKOH/g.

Synthesis Example 8

Synthesis of a Carboxyl Group-Containing Epoxy Acrylate (a Mixture Type of Novolac Type and Bisphenol A Type, B-2)

Into a container equipped with a stirring device, a thermometer, a reflux condenser and a gas introduction tube, 87.6 parts of the cresol novolac type epoxy resin "EOCN-104S" which was the same as used in Synthesis Example 3, 92.8 parts of a bisphenol A type epoxy resin (trade name "YD-901"; made by Tohto Kasei Co., Ltd.; epoxy equivalent 463.9), 52.2 parts of methacrylic acid, 196.7 parts of propylene glycol monomethyl ether acetate, 0.7 part of benzyltriphenyl phosphonium chloride as an esterification catalyst, and 0.3 part of methylhydroquinone as a polymerization inhibitor were added and reacted at 120° C. for 20 hours to confirm that an acid value of the reaction product was 3.2 mgKOH/g. Then, 75.1 parts of tetrahydrophthalic anhydride and 0.2 part of benzyltriethyl ammonium chloride as an esterification catalyst were added and reacted at 110° C. for 5 hours to obtain a propylene glycol monomethyl ether acetate solution containing 61% of a carboxyl group-containing epoxy acrylate (B-2) having an acid value of 97 mgKOH/g.

Synthesis Example 9

Batch Synthesis of a Mixture (B-3) of an Acid-Modified Vinyl Ester and a Carboxyl Group-Containing Novolac Type Epoxy Acrylate Into a container equipped with a stirring device, a thermometer, a reflux condenser and a gas introduction tube, 113 parts of a bisphenol A type epoxy resin (trade name "YD-127"; made by Tohto Kasei Co., Ltd.; epoxy equivalent 183.7), 38.5 parts of bisphenol S, 191.3 parts of propylene glycol monomethyl ether acetate, and 0.5 part of benzyltriethyl ammonium chloride as a reaction catalyst were added and reacted at 140° C. for 6 hours to confirm completion of the reaction of a phenolic hydroxyl group and an epoxy group by the quantification of an epoxy group, and then, 202.1 parts of the cresol novolac type epoxy resin "EOCN-104S" which was the same as used in Synthesis Example 3 and 191.3 parts of propylene glycol monomethyl ether acetate were added and dissolved to form a homogeneous solution. Subsequently, 107 parts of methacrylic acid, 1.4 parts of triphenylphosphine as an esterification catalyst, and 0.6 part of methylhydroquinone as a polymerization inhibitor were added and reacted at 120° C. for 20 hours to confirm that an acid value of the reaction product was 2.9 mgKOH/g. Then, 138 parts of tetrahydrophthalic anhydride was added and reacted at 110° C. for 5 hours to obtain a propylene glycol monomethyl ether acetate solution containing 61% of a mixture (B-3) of an acid-modified vinyl ester having an acid value of 91 mgKOH/g and a carboxyl group-containing novolac type epoxy acrylate.

Examples 1 to 6 and Comparative Examples 1 to 3

Acid-modified vinyl ester compositions having the blending ratios shown in Table 1 were prepared by using each of the resin solutions obtained in Synthesis Examples 1 to 9. Evaluations by the following methods were carried out on these compositions and results were described in combination in Table 1.

[Developability]

Each composition was coated on a cupper plate so as to have a film thickness after drying of 30 μm and then heated at 80° C. for 30 minutes. Subsequently, the plate was immersed in 1% sodium carbonate aqueous solution at 30° C. for 180 seconds, and a remaining degree of the coating film was visually evaluated according to the following criteria.

○: Development was perfectly done.

x: Adhesive was deposited.

[Photo-Curability]

A dried coating film obtained in the same manner as in the developability evaluation was exposed at 2 J/cm$^2$ by using an ultraviolet irradiation device, and then immersed in 1% sodium carbonate aqueous solution at 30° C. for 180 seconds, and photo curability was evaluated according to a degree of remaining of the coating film.

○: The coating film was perfectly remained.

x: The coating film was peeled.

[Boiling Resistance]

A dried coating film obtained in the same manner as in the developability evaluation was exposed at 2 J/cm$^2$ by using an ultraviolet irradiation device, heated at 160° C. for 30 minutes, and then immersed in boiled ion exchange water for 60 seconds. The condition of the coating film after immersion was visually evaluated according to the following criteria.

○: The coating film had nothing peculiar in appearance.

x: A part of the coating film was swelled or peeled.

[Bending Resistance]

Each composition was coated on a polyethylene terephthalate film so as to have a film thickness after drying of about 100 μm and then heated at 80° C. for 30 minutes. Subsequently, the film was exposed at 2 J/cm$^2$ by using an ultraviolet irradiation device, and further, heated at 160° C. for 1 hour. After cooling the test piece to room temperature, a cured film was obtained by peeling from the polyethylene terephthalate film. This cured film was subjected to an evaluation of bending resistance by using an axle with 10 mmϕ according to 8.1 of JIS K 5400$^{-1990}$. Presence or absence of the occurrence of a crack was visually evaluated.

○: No crack occurred.

x: A crack occurred.

[Heat Resistance: Glass Transition Temperature]

A glass transition temperature (Tg) in a tension mode as an index of heat resistance was measured for a cured film obtained in the same manner as in the bending resistance evaluation by using a heat analyzer TMA.

TABLE 1

Blending ratios of an acid-modified vinyl ester composition (numbers indicate parts), Evaluation results

|  | Examples | | | | | | Comparative Examples | | |
|---|---|---|---|---|---|---|---|---|---|
|  | 1 | 2 | 3 | 4 | 5 | 6 | 1 | 2 | 3 |
| Vinyl ester, epoxy acrylate (solid content): | | | | | | | | | |
| A - 1 | 30 | | | | | | | | |
| A - 2 | | 30 | | | | | | | |
| A - 3 | | | 100 | | | | | | |
| A - 4 | | | | 100 | | | | | |
| A - 5 | | | | | 100 | | | | |
| A - 6 | | | | | | 100 | | | |
| B - 1 | 70 | 70 | | | | | 100 | | |
| B - 2 | | | | | | | | 100 | |
| B - 3 | | | | | | | | | 100 |
| Multifunctional monomer: | | | | | | | | | |
| A - 9300 (ethoxylated isocyanuric acid triacrylate, made by Shin-nakamura Chemical Corporation) | 10 | 10 | 10 | 10 | 10 | 10 | 10 | 10 | 10 |
| Photopolymerization initiator: | | | | | | | | | |
| Irgacure 907 (made by Ciba Specialty Chemicals K.K.) | 5 | 5 | 5 | 5 | 5 | 5 | 5 | 5 | 5 |
| Epoxy resin: | | | | | | | | | |
| YDPN-638P (phenol novolac type epoxy resin, made by Tohto Kasei Co., Ltd.) | 30 | 30 | 30 | 30 | 30 | 30 | 30 | 30 | 30 |
| Epoxy curing agent: | | | | | | | | | |
| Dicyandiamide | 2 | 2 | 2 | 2 | 2 | 2 | 2 | 2 | 2 |
| Developability | ○ | ○ | ○ | ○ | ○ | ○ | ○ | ○ | ○ |
| Photo-curability | ○ | ○ | ○ | ○ | ○ | ○ | ○ | ○ | ○ |
| Boiling resistance | ○ | ○ | ○ | ○ | ○ | ○ | X | X | ○ |
| Bending resistance | ○ | ○ | ○ | ○ | ○ | ○ | X | ○ | ○ |
| Tg (° C.) | 122 | 125 | 124 | 122 | 118 | 132 | 109 | 104 | 107 |

Examples 7 to 14 and Comparative Examples 4 to 6

Solder resists having the blending ratios shown in Table 2 were prepared by using each of the resin solutions obtained in Synthesis Examples 1 to 9.

TABLE 2

|  | Examples | | | | | | | | Comparative Examples | | |
|---|---|---|---|---|---|---|---|---|---|---|---|
|  | 7 | 8 | 9 | 10 | 11 | 12 | 13 | 14 | 4 | 5 | 6 |
| A - 1 | 30 | | | | | | | | | | |
| A - 2 | | 30 | | | | | | | | | |
| A - 3 | | | 100 | | | | | | | | |
| A - 4 | | | | 100 | | | 100 | 100 | | | |
| A - 5 | | | | | 100 | | | | | | |
| A - 6 | | | | | | 100 | | | | | |
| B - 1 | 70 | 70 | | | | | | | 100 | | |
| B - 2 | | | | | | | | | | 100 | |
| B - 3 | | | | | | | | | | | 100 |
| DPHA [1] | 20 | 20 | 20 | 20 | 20 | 20 | 20 | 20 | 20 | 20 | 20 |
| DAROCUR TPO [2] | 10 | 10 | 10 | 10 | 10 | 10 | 6 | 10 | 10 | 10 | 10 |
| CGI - 325 [3] | | | | | | | 2 | | | | |
| IRGACURE OXE 02 [4] | | | | | | | 0.5 | | | | |
| RE - 306 [5] | | | | | | | | 35 | | | |
| YX4000 [6] | 30 | 30 | 30 | 30 | 30 | 30 | 30 | | 30 | 30 | 30 |
| NC - 3000 [7] | 5 | 5 | 5 | 5 | 5 | 5 | 5 | | 5 | 5 | 5 |
| Melamine (adhesion imparting agent) [8] | 2 | 2 | 2 | 2 | 2 | 2 | 2 | 2 | 2 | 2 | 2 |

TABLE 2-continued

|  | Examples | | | | | | | | Comparative Examples | | |
| --- | --- | --- | --- | --- | --- | --- | --- | --- | --- | --- | --- |
|  | 7 | 8 | 9 | 10 | 11 | 12 | 13 | 14 | 4 | 5 | 6 |
| Dicyandiamide | 1 | 1 | 1 | 1 | 1 | 1 | 1 | 1 | 1 | 1 | 1 |
| Phthalocyanine blue | 2 | 2 | 2 | 2 | 2 | 2 | 2 | 2 | 2 | 2 | 2 |

Remarks
[1] dipentaerythritol hexaacrylate,
[2] a photopolymerization initiator, made by Ciba Specialty Chemicals K.K.
[3] [4] an oxime structure-containing photopolymerization initiator, made by Ciba Specialty Chemicals K.K.,
[5] a novolac type epoxy resin, made by Nippon Kayaku Co., Ltd.,
[6] a biphenyl type epoxy resin, made by Japan Epoxy Resins Co., Ltd.,
[7] a biphenyl novolac type epoxy resin, made by Nippon Kayaku Co., Ltd.,
[8] made by Mitsubishi Chemical Corporation Performance evaluations of each of the solder resists were conducted according to the following methods. Results are shown in Table 3.

<Preparation of a Dry Film>

Each of the solder resists was diluted with methyl ethyl ketone appropriately, and then coated on a PET film (made by Toray Industries, Inc.: FB-50: 16 μm) so as to have a film thickness after drying of 30 μm by using an applicator and dried at in the range of 40° C. to 100° C. to obtain a dry film.

<Preparation of a Substrate>

A substrate on which a circuit was formed was subjected to buffing, and then the dry film prepared by the above described method was heat-laminated in the condition: a pressure of 0.8 MPa, 70° C. for 1 minute under a degree of vacuum of 133.3 Pa by using a vacuum laminator (MVLP-500, made by Meiki Co., Ltd.) to obtain a substrate having an unexposed solder resist layer (unexposed substrate).

(1) Photosensitivity

A Kodak No. 2 step tablet was applied to the unexposed substrate to determine an irradiation amount with five steps.

(2) Solder Heat Resistance

A negative pattern on which a solder resist pattern was drawn was applied to the unexposed substrate, and then light having the above obtained irradiation amount was applied thereto to photo-cure the solder resist layer. A carrier film was peeled after photo-irradiation, and development was carried out by a developer at a spray pressure of 0.2 MPa using 1% sodium carbonate aqueous solution at 30° C., resulting in being formed patterns. Then, a cured coating film was obtained by heat curing at 160° C. for 60 minutes.

A rosin based flux was applied on the cured coating film and the coating film was immersed in a solder bath at 260° C. for 30 seconds or 60 seconds, and a condition of the cured coating film was evaluated according to the following criteria.

⊙: Cured coating film with no swelling, peeling, and color change in immersing for 60 seconds.

○: Cured coating film with no swelling, peeling, and color change in immersing for 30 seconds.

Δ: Cured coating film with slight swelling, peeling, and color change in immersing for 30 seconds.

x: Cured coating film with swelling, peeling, and color change in immersing for 30 seconds.

(3) Electroless Gold Plating Resistance

The unexposed substrates were subjected to photo-irradiation and development in the same manner as described above and then thermally cured to prepare evaluation substrates (plating substrates). Each of these plating substrates was immersed in an acid defatted liquid (aqueous solution of 20 volume % of Metex L-5B, made by Nippon MacDermid Co., Inc.) at 30° C. for 3 minutes to be defatted, and then washed with water by immersing in flowing water for 3 minutes. Each of the substrates was immersed in 14.3% ammonium persulfate aqueous solution at room temperature for 3 minutes to be soft-etched, and then washed with water by immersing in flowing water for 3 minutes. After immersing the substrate in an aqueous solution of 10 volume % of sulfuric acid at room temperature for 1 minute, the substrate was washed with water by immersing in flowing water for 30 seconds to 1 minute. This substrate was immersed in a catalyst liquid (aqueous solution of 10 volume % of Melplate Activator 350, made by Meltex Inc.) at 30° C. for 7 minutes to give a catalyst, and then washed with water by immersing in flowing water for 3 minutes. The substrate to which a catalyst was given was immersed in a nickel plating liquid (made by Meltex Inc., aqueous solution of 20 volume % of melplate Ni-865M, pH 4.6) at 85° C. for 20 minutes to perform electroless nickel plating. After immersing the substrate in an aqueous solution containing 10 volume % of sulfuric acid for 1 minute, the substrate was washed with water by immersing in flowing water for 30 seconds to 1 minute. Subsequently, the substrate was immersed in a gold plating liquid (manufactured by Meltex, Inc., an aqueous solution of 15 volume % of Aurolectroless UP and 3 volume % of gold potassium cyanide, pH 6) at 95° C. for 10 minutes to perform electroless gold plating, and then washed with water by immersing the substrate in flowing water for 3 minutes and washed with hot water by immersing it in hot water at 60° C. for 3 minutes. Further, after washing the substrate sufficiently, the substrate was well drained off water and dried to obtain an electroless gold plated substrate. A peeling test of the plated substrate was conducted by using a cellophane adhesive tape, and peeling of the coating film and color change were evaluated according to the following criteria.

○: No change was observed.

Δ: The coating film was slightly peeled, or color change was observed.

x: Peeling of the coating film was observed.

(4) PCT Resistance

The unexposed substrates were subjected to photo-irradiation and development in the same manner as described above and then thermally cured to prepare an evaluation substrate having a cured resist layer. This substrate was placed in a high pressure, high temperature, and high humidity chamber at 121° C., 2 atm, and a humidity of 100% for 168 hours or 192 hours, and change of the state of the cured coating film was evaluated. Evaluation follows the criteria described below.

⊙: No peeling, color change and elusion occurred in 192 hours.

○: No peeling, color change and elusion occurred in 168 hours.

Δ: One of peeling, color change and elusion occurred in 168 hours.

x: Peeling, color change and elusion occurred extensively in 168 hours.

(5) Insulation after Humidification Test (HAST)

The dry film was laminated on a substrate on which a comb type electrode (line/space=50 μm/50 μm) was formed in the same manner as described above. The substrate after lamination was subjected to photo-irradiation and development, and then thermally cured in the same manner as described above to prepare an evaluation substrate. The evaluation substrate was placed in a high temperature, high humidity chamber in an atmosphere at 130° C. and a humidity of 85%, and was charged a voltage of 5 V to conduct HAST (Highly Accelerated Stress Test) for 168 hours or 192 hours. Electrical insulation after HAST was measured.

⊚: An electrical insulation was $10^{10}\Omega$ or more in 192 hours.
○: An electrical insulation was $10^{10}\Omega$ or more in 168 hours.
Δ: An electrical insulation was $10^{8}\Omega$ or more and less than $10^{10}\Omega$ in 168 hours.
x: An electrical insulation was less than $10^{8}\Omega$ in 168 hours.

(6) TCT Resistance

The dried film was laminated on a substrate on which 2 mm of a cupper line pattern was formed in the same manner as described above. The substrate after lamination was subjected to photo-irradiation and development, and then thermally cured in the same manner as described above to prepare an evaluation substrate on which 3 mm square-resist pattern was formed on a cupper line. The evaluation substrate was placed in a temperature cycle machine that performs temperature cycles between −65° C. and 150° C., and appearances at 600 cycles, 800 cycles and 1000 cycles were observed.

⊚: Nothing peculiar was observed at 1000 cycles.
○: Nothing peculiar was observed at 800 cycles, and a crack occurred at 1000 cycles.
Δ: Nothing peculiar was observed at 600 cycles, and a crack occurred at 800 cycles.
x: A crack occurred at 600 cycles.

TABLE 3

| | Examples | | | | | | | | Comparative Examples | | |
|---|---|---|---|---|---|---|---|---|---|---|---|
| | 7 | 8 | 9 | 10 | 11 | 12 | 13 | 14 | 4 | 5 | 6 |
| Photosensitivity (irradiation amount: mJ/cm$^2$) | 600 | 600 | 600 | 600 | 800 | 600 | 200 | 600 | 300 | 300 | 600 |
| Solder heat resistance | ⊚ | ⊚ | ⊚ | ⊚ | ○ | ⊚ | ⊚ | ⊚ | ⊚ | ○ | ○ |
| Electroless gold plating resistance | ○ | ○ | ○ | ○ | ○ | ○ | ○ | ○ | ○ | ○ | ○ |
| PCT resistance | ⊚ | ⊚ | ⊚ | ⊚ | ⊚ | ⊚ | ⊚ | ○ | X | Δ | ○ |
| Insulation after HAST | ○ | ○ | ○ | ○ | ⊚ | ○ | ○ | ○ | X | Δ | Δ |
| TCT resistance | ⊚ | ⊚ | ⊚ | ⊚ | ⊚ | ⊚ | ⊚ | ○ | X | Δ | Δ |

As is clear from Table 3, the solder resists of the present invention (Examples 7 to 14) are excellent in solder heat resistance, electroless gold plating resistance, PCT resistance, insulation after HAST, and TCT resistance, that are required to a resist for a package substrate. Further, as shown in Example 13, it was confirmed that using an oxime structure-containing photopolymerization initiator realizes high sensitization without deteriorating characteristics. In Example 14, since an epoxy resin not having a biphenyl structure was used as a heat curing compound, results of PCT resistance and TCT resistance were somewhat inferior, however, it was confirmed that the results were better than Comparative Examples 4 to 6.

On the other hand, in Comparative Examples 4 and 5 in which commodity carboxyl group-containing photosensitive resins of B-1 and B-2 were used, PCT resistance, insulation after HAST, and TCT resistance were inferior. Further, in Comparative Example 6 in which an acid-modified vinyl ester having a bisphenol S structure but not having a biphenyl structure was used, PCT resistance was preferable, however, insulation after HAST and TCT resistance that are important features required for a resist for a package substrate were inferior.

INDUSTRIAL APPLICABILITY

Since the solder resist of the present invention has both alkali developability and photo curability, and further, contains an acid-modified vinyl ester which gives a cured product being excellent in dimensional stability against temperature change and not exhibiting brittleness as a resin component, physical properties of the cured product can be excellent. Therefore, the solder resist can be preferably used as a resist ink for a printed wiring board capable of alkali development.

Moreover, since the dry film, the cured product and the printed wiring board of the present invention are obtained from the above described solder resist, they are excellent not only in the above described characteristics but also in water resistance, electrical insulation, thermal cycle resistance (TCT resistance) and the like.

The invention claimed is:

1. A solder resist comprising an acid-modified vinyl ester synthesized from an epoxy compound, a phenol compound, an unsaturated monobasic acid and a polybasic acid anhydride, and a compound having two or more functional groups reactable with a carboxyl group in one molecule, wherein
   the epoxy compound contains a crystalline epoxy resin having a melting point of 90° C. or more,
   the phenol compound contains a compound having a bisphenol S structure,
   the compound having two or more functional groups reactable with a carboxyl group in one molecule contains a biphenyl epoxy resin and a biphenyl novolac epoxy resin,
   an amount of an epoxy compound other than the crystalline epoxy resin is 75 mol % or less when the entire epoxy compound is 100 mol %,
   an amount of a phenol compound having no biphenol S structure is 75 mol % or less when the entire phenol compound is 100 mol %, and
   an amount of the compound having two or more functional groups reactable with a carboxyl group in one molecule is 5 parts by mass to 70 parts by mass relative to 100 parts by mass of a total of a resin solid content (a total amount of the acid-modified vinyl ester and a solid content of a radical polymerizable resin) and a radical polymerizable monomer content.

2. The solder resist according to claim 1, wherein the crystalline epoxy resin has a biphenyl structure.

3. The solder resist according to claim 1, wherein a use amount of the phenol compound is 0.3 mol or more and 0.8 mol or less relative to 1 mol of the epoxy compound.

4. The solder resist according to claim 1, further comprising an epoxy acrylate.

5. The solder resist according to claim 1, wherein the epoxy acrylate contains a carboxyl group-containing epoxy acrylate.

6. A dry film comprising a solder resist layer obtained by coating the solder resist according to claim 1 on a carrier film and drying.

7. A cured product obtained by curing the solder resist according to claim 1 by active energy ray irradiation and/or heating.

8. A printed wiring board comprising a protective film obtained by curing the solder resist according to claim 1 on a circuit substrate having a conductor layer of a given circuit pattern.

9. A cured product obtained by curing the solder resist layer of the dry film according to claim 6 by active energy ray irradiation and/or heating.

10. A printed wiring board comprising a protective film obtained by curing the solder resist layer of the dry film according to claim 6 on a circuit substrate having a conductor layer of a given circuit pattern.

\* \* \* \* \*